United States Patent

[11] 3,634,151

[72] Inventors Tomi Sato;
Keiji Matsumoto, both of Osaka, Japan

[21] Appl. No. 33,584
[22] Filed May 1, 1970
[45] Patented Jan. 11, 1972

[73] Assignee Matsushita Electric Industrial Co., Ltd.
Kadoma, Osaka, Japan

[54] METHOD FOR MAKING SEMICONDUCTOR DEVICES

8 Claims, 4 Drawing Figs.

[52] U.S. Cl. .......... 148/178, 148/179, 148/181, 148/185
[51] Int. Cl. .......... H01l 7/46
[50] Field of Search .......... 148/177, 178, 179, 181, 185, 1.5

[56] References Cited

UNITED STATES PATENTS 3,544,395 12/1970 Terasaki .......... 148/178

*Primary Examiner*—Richard O. Dean
*Attorney*—Wenderoth, Lind & Ponack

ABSTRACT: A method is provided for making a PN-junction semiconductor. A crystalline semiconductor wafer having a metal dot placed upwardly thereon is heated to cause the dot to adhere to the wafer. The wafer is then turned upside down at room temperature. The wafer is then heated at a temperature higher than the adhering temperature to cause the dot to interact with the wafer to form a hyperabrupt junction silicon diode.

INVENTORS
TOMI SATO
KEIJI MATSUMOTO

BY Wenderoth, Lind & Ponack
ATTORNEYS

METHOD FOR MAKING SEMICONDUCTOR DEVICES

This invention relates to a method for making a PN junction between a crystalline semiconductor wafer and a metal dot, and more particularly to a method for making a PN junction characterized by a small leakage current.

The alloying method is known to be one method for making a junction such as a PN junction or the like. In this method, a metal dot is placed on a crystalline semiconductor wafer, for example, in a P-type semiconductivity and is heated at a high temperature. The metal dot includes an active material, for example, a donor material. During the heating process, the metal dot eats the crystalline semiconductor wafer at the contact area. The eaten part forms a precipitation layer of an N-type semiconductor during a cooling process. A PN junction is formed between the crystalline semiconductor wafer and the precipitation layer. The difficulty in this method is to control the shape of the contact area. In the conventional method, the metal dot is always placed upwardly on the crystalline semiconductor wafer. The shape of contact area is apt to vary with the surface condition of the wafer and the wettability between the metal dot and the wafer. The variation results in difficulty in controlling the leakage current of the formed junction.

Therefore, an object of this invention is to provide an alloying method capable of controlling the shape of the contact area between a metal dot and a crystalline semiconductor wafer.

Another object of this invention is to provide an alloying method capable of controlling the leakage current of the resultant junction.

These and other objects will be apparent from the consideration of the following detailed description taken together with the accompanying drawings, wherein.

A method according to the present invention comprises heating a crystalline semiconductor wafer having a metal dot placed upwardly on one surface thereof, whereby said metal dot melts and adheres to said one surface, turning said wafer upside down so that said adhered metal dot is placed downwardly on said one surface, further heating the turned wafer at a temperature higher than the adhering temperature so as to cause said metal dot to interact with said wafer and cooling said turned wafer to room temperature.

Figure 1:
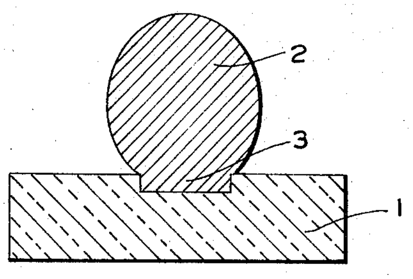
FIG. 1 is a cross-sectional view of a crystalline semiconductor wafer having a metal dot adhered thereto.

Referring to FIG. 1, a metal dot 2 of a given composition is placed on a crystalline semiconductor wafer 1. Said metal dot 2 has a melting point lower than that of said crystalline semiconductor wafer 1. Said metal dot 2 on said crystalline semiconductor wafer 1 is heated in a nonoxidizing atmosphere at an adhering temperature between melting points of said metal dot 2 and said wafer 1. During heating, said metal dot 2 melts to form a sphere and adheres to the surface of said wafer 1 at the connecting area 3.

Figure 2:
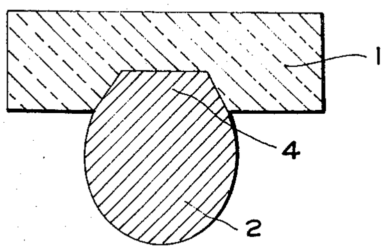
FIG. 2 is a cross-sectional view of the crystalline semiconductor wafer of FIG. 1 turned upside down at a heating step.

Even when said wafer 1 having said metal dot 2 adhered thereto is turned upside down at the adhering temperature, said metal dot 2 does not fall from said wafer 1. Said wafer 1 having said alloy dot 2 placed downwardly is further heated in a nonoxidizing atmosphere at a further heating temperature higher than said adhering temperature and lower than the melting point of said wafer 1. During further heating, said molten metal dot 2 eats said wafer 1 as shown in FIG. 2 and dissolves ingredients of said wafer 1 up to the solubility amount. At the highest temperature of this further heating, the molten metal dot 2 has a composition essentially the same as the eaten part 4.

Figure 3:
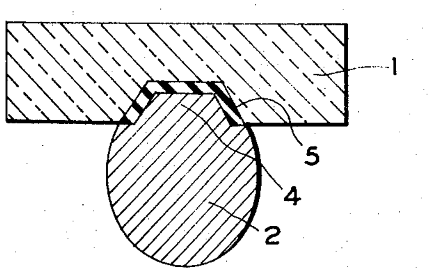
FIG. 3 is a cross-sectional view of the crystalline semiconductor wafer of FIG. 2 at a cooling step.

During cooling to room temperature, the dissolved ingredients precipitate at the eaten part 4 as well as the surface of said metal dot 2 and forms a precipitation layer 5 predominantly at said eaten part as shown in FIG. 3. Said precipitation layer 5 shows an epitaxial growth and completes a junction at the contact area with said wafer 1. The contact area according to the present invention has a regular shape based on the indices of the surface plane of the wafer, for example, a triangle shape on the [111] plane and a square shape on the [100] plane.

The crystalline semiconductor wafer referred to herein is defined as a semiconductor capable of forming a PN junction or the like with a metal dot.

The metal dot referred to herein is defined as a metal consisting of an element capable of being a donor or an acceptor for said semiconductor or an alloy consisting essentially of at least one element selected from the group consisting of a donor material, an acceptor material and a carrier material for said semiconductor.

A silicon single-crystal semiconductor and a germanium single-crystal semiconductor can be combined with a metal consisting of either aluminum or indium. The operable alloy for these semiconductors comprise at least one carrier metal such as tin, lead, gold, silver and their alloy and at least one active material such as phosphor, arsenic, antinony, bismuth, boron, aluminum, gallium and indium.

The junction formed by a method according to the present invention has a leakage current lower than that by a conventional method. Particularly, this effect is enhanced when said metal dot comprises, as an acceptor, aluminum.

For convenience of practice, it is preferable that said wafer having the metal dot adhered thereto is turned upside down after being cooled to room temperature. The turned wafer is placed in a furnace and is heated to a further heating temperature.

A better adhesion between said metal dot and said wafer can be obtained by heating said wafer having said metal dot placed thereon in a reduced pressure lower than $5\times10^{-5}$ mm. Hg.

A method according to the present invention is particularly effective for a formation of a hyperabrupt junction silicon diode including, as an acceptor, aluminum. A novel method according to the present invention comprises (1) heating a P-type silicon semiconductor wafer having an alloy dot placed upwardly on one surface thereof at an adhering temperature of 540° C. to 940° C. in a reduced pressure of air lower than $5\times10^{-}$mm. Hg whereby said alloy dot melts and adheres to said one surface, (2) turning said wafer upside down at room temperature so that said adhered alloy dot is placed downwardly on said one surface, (3) further heating said wafer with said alloy dot at a temperature of 960° C. to 1080° C. in a nonoxidizing gas for a time period of from 5 to 40 minutes so that said alloy dot eats said wafer at the contact area, and (4) cooling said wafer eaten at the contact area by said alloy dot. Said alloy dot consists essentially of an alloy of tin, antimony and aluminum in a weight proportion Sn:SB:Al=300≈1,500:25≈100:1. Said P-type silicon wafer has a specific resistivity of 5 to 100 ohm-cm. The hyperabrupt junction silicon diodes prepared by a method according to the present invention have a leakage current lower than that by a conventional method.

EXAMPLE

A polished silicon P-type semiconductor wafer is put in a quartz boat. An alloy dot with a composition as shown in table 1 is placed on the wafer. The wafer is in a square form of 2×2 mm. and is 0.2 mm. thick. The alloy dot is in a tablet form having a diameter of 0.5 mm. and a height of 0.5 mm.

Table 1

WEIGHT PART OF ALLOY DOT

| Al | Sb | Sn |
|---|---|---|
| 1 | 55 | 800 |

Figure 4:
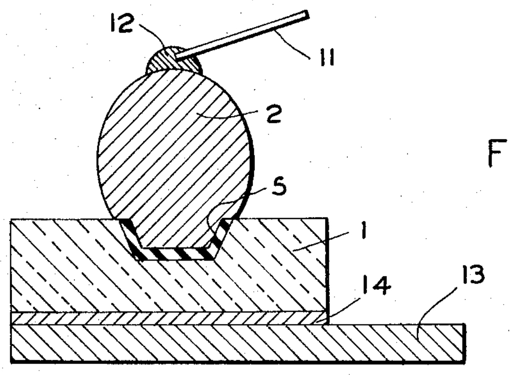
FIG. 4 is a cross-sectional view of one embodiment of a hyperabrupt junction silicon diode prepared by the method according to the present invention.

The alloy dot on the wafer is heated at an adhering temperature of 660° C. for 20 minutes in a reduced pressure of $2\times10^{-5}$ mm. Hg. During heating, the alloy dot melts to form into a sphere and adheres to the wafer at the contact area. The cooled wafer is turned upside down so that the sphere alloy dot is positioned beneath the wafer. The turned wafer in the quartz boat is further heated in hydrogen at 1,040° C. for 25 minutes. At the temperature of 1,040° C., the alloy dot eats the wafer at the contact area and dissolves silicon therein up to the solubility amount at the temperature. At the same time, aluminum atoms in the alloy dot diffuse into the water from the contact area. During cooling to room temperature, the dissolved silicon precipitates predominantly at the eaten part and forms a hyperabrupt junction silicon diode. The cooled silicon diode is provided with a lead wire 11 at the alloy dot 2 by using a conventional solder 12 and with a molybdenum electrode 13 at the free surface of the wafer 1 by using an Al-Si eutectic solder 14 as shown in FIG. 4.

One thousand samples of hyperabrupt junction silicon diodes are prepared at the same time in a manner exactly similar to that described above. The distribution of leakage currents of 1,000 silicon diodes have been examined. On the other hand, 1,000 other samples of hyperabrupt junction silicon diodes are prepared in a manner exactly similar to that described above, except for the wafers having alloy dots adhered thereto but not turned upside down. Table 2 shows a comparison in the distribution of leakage current between the novel method according to the present invention and the conventional method.

TABLE 2

| leakage current at −30 v. (mμA) | percentage | |
|---|---|---|
| | novel method | conventional method |
| <50 | 10 | 0 |
| 50 ≈ 100 | 7 | 4 |
| 100 ≈ 200 | 24 | 3 |
| 200 ≈ 500 | 18 | 10 |
| 500 ≈ 1,000 | 13 | 16 |
| 1,000 ≈ 2,000 | 16 | 15 |
| >2,000 | 12 | 52 |

What is claimed is:

1. A method for making a PN junction semiconductor device comprising heating a crystalline semiconductor wafer having a metal dot placed upwardly on one surface thereof, whereby said metal dot melts and adheres to said one surface, turning said wafer upside down so that said adhered metal dot is placed downwardly on said one surface, further heating said turned wafer at a temperature higher than the adhering temperature so as to cause said metal dot to interact with said wafer and cooling said turned wafer to room temperature.

2. The method defined by claim 1 wherein said wafer having said metal dot adhered to one surface thereof is turned upside down at room temperature.

3. The method defined by claim 1 wherein said metal dot contains aluminum as an active constituent.

4. The method defined by claim 1 wherein said crystalline semiconductor wafer having a metal dot placed upwardly on one surface thereof is heated in a reduced pressure lower than $5\times10^{-}$mm. Hg.

5. The method defined by claim 1 wherein said crystalline semiconductor wafer is a member selected from the group consisting of a germanium single crystal and a silicon single crystal.

6. The method defined by claim 5 wherein said metal dot consists of a metal selected from the group consisting of aluminum and indium.

7. The method defined by claim 5 wherein said metal dot comprises at least one carrier metal selected from the group consisting of tin, lead, gold, silver and their alloy and at least one active material selected from the group consisting of phosphor, arsenic, antimony, bismuth, boron, aluminum, gallium and indium.

8. A method for making a silicon diode provided with hyperabrupt PN-junction, said method comprising heating a P-type silicon wafer having an alloy dot placed upwardly on one surface thereof at a temperature of 540° C. to 940° C. in a reduced pressure of air lower than $5\times10^{-5}$ mm. Hg, whereby said alloy dot melts and adheres to said one surface, said alloy dot including tin, antimony and aluminum; turning said wafer upside down at room temperature so that said adhered alloy dot is placed downwardly on said one surface; further heating said turned wafer at a temperature of 960° C. to 1,080° C. in hydrogen gas for a time period of 5 to 40 minutes; and cooling said turned wafer to room temperature.

* * * * *